United States Patent [19]

Glover et al.

[11] Patent Number: 4,740,753

[45] Date of Patent: Apr. 26, 1988

[54] MAGNET SHIMMING USING INFORMATION DERIVED FROM CHEMICAL SHIFT IMAGING

[75] Inventors: Gary H. Glover, Delafield, Wis.; Grant T. Gullberg, Salt Lake City, Utah

[73] Assignee: General Electric Company, Milwaukee, Wis.

[21] Appl. No.: 20,186

[22] Filed: Feb. 27, 1987

Related U.S. Application Data

[63] Continuation of Ser. No. 816,076, Jan. 3, 1986, abandoned.

[51] Int. Cl.$^4$ ............................................. G01R 33/20
[52] U.S. Cl. .................................... 324/320; 324/318
[58] Field of Search .............. 324/307, 309, 312, 320, 324/318, 322; 364/414

[56] References Cited

U.S. PATENT DOCUMENTS 4,585,992 4/1986 Maudsley et al. .................. 324/309
4,623,844 11/1986 Macovski ........................... 324/320
4,652,826 3/1987 Yamamoto et al. ................ 324/320
4,661,775 4/1987 Kormos et al. ..................... 324/312

Primary Examiner—Stewart J. Levy
Assistant Examiner—Kevin D. O'Shea
Attorney, Agent, or Firm—Mark L. Mollon; Douglas E. Stoner

[57] ABSTRACT

A method for shimming a magnet in a nuclear magnetic resonance (NMR) system employs measurements of the magnetic field obtained from chemical shift imaging (CSI) of a homogeneous phantom. The data are acquired, in one embodiment, in four planes parallel to, and rotated about, the axis of the magnet. A special volume subset of data are expanded in an orthonormal basis set (associated Legendre polynomials in one embodiment) for N+1 separate experiments, where N is the number of shim coils to be adjusted. The result is an N×N matrix of calibration coefficients for the shim coil set and a vector of shim current changes which must be applied to null out the measured field inhomogeneity.

7 Claims, 3 Drawing Sheets

MAGNET SHIMMING USING INFORMATION DERIVED FROM CHEMICAL SHIFT IMAGING

This application is a continuation of application Ser. No. 816,076, filed Jan. 3, 1986, now abandoned.

BACKGROUND OF THE INVENTION

This invention relates to nuclear magnetic resonance (NMR) methods and apparatus. More specifically, this invention relates to magnet shimming techniques based on magnetic field measurements deduced from chemical shift imaging (CSI) of a homogeneous volume.

The nuclear magnetic resonance phenomenon has been utilized in the past in high resolution NMR spectroscopy instruments by structural chemists to analyze the structure of chemical compositions. More recently, NMR has been developed as a medical diagnostic modality having applications in imaging the anatomy, as well as performing in vivo, non-invasive, spectroscopic analyses. As is now well known, the NMR phenomenon can be excited within a sample object, such as a human patient, positioned in a polarizing magnetic field $B_o$ by application, in a well-known manner, of pulse sequences comprised of RF and gradient magnetic field pulses. The NMR signals, induced by the excitation, emanating from the object are then detected and used to derive NMR imaging or spectroscopic information about the object studied.

The advent of whole-body NMR imaging and spectroscopic techniques has led to stringent requirements for homogeneity of the polarizing magnetic field over large volumes in wide-bore magnets. The polarizing magnetic field may be provided by a number of magnet types, such as permanent magnets, resistive electromagnets, or superconductive magnets. The latter are particularly desirable in that high fields may be created and maintained without large energy input requirements. However, in all of these NMR magnet types, the intrinsic magnetic fields are generally not sufficiently homogeneous to perform the desired imaging or spectroscopic measurements to desirable resolutions for medical application. Most standard NMR imaging and spectroscopic pulse techniques require a field homogeneity better than about ±4 ppm. (±250 Hz. at 1.5 Tesla) over the volume of interest. Some chemical shift imaging (CSI) techniques require much better homogeneity (less than 1 ppm). In-vivo spectroscopy of carbon ($^{13}C$) and phosphorus ($^{31}P$) places even more severe requirements on the measurement and correction of heterogeneity especially with the presence of field distortion caused by the object studied, itself.

To improve the homogeneity of the polarizing magnetic field, produced by the main magnet, magnet systems typically include correction coils having a variety of geometries. The correction coils, which are also known as shim coils, include both axisymmetric coils and transverse coils. The axisymmetric coils are generally disposed in a helical pattern on a cylindrical coil form while the transverse correction coils are generally disposed in a so-called saddle shape. Each coil has its own current control and ideally is designed to produce a field orthogonal to that of all the other coils. In practice, some coils, such as $Z^2X$ and $Z^2Y$, produce fields which have nonorthogonal components. Correction of field heterogeneity involves adjustment of the individual shim coil currents so that the combined fields of the shim coils just balance the error field in the polarizing magnetic field produced by the main magnet. The procedure is often referred to as shimming.

The need exists for a quick and accurate (and, ideally, automated) method for shimming the main magnet. Several approaches have been used in the past. In one class of techniques, measurements of field intensity at strategic locations within the magnet bore are utilized to optimize a given shim current energizing a particular shim coil. This technique is often employed in the initial stages in magnet setup to approximate the desired degree of field homogeneity. As an example, if magnetic field measurements are obtained with a magnetometer probe along a given axis, the shim currents in the shim coil designed to correct the field along that axis can be adjusted. A difficulty which arises with this and other prior art methods to be described is that field measurements are made in air so that field distortions caused by the object studied are not compensated.

In a second class of techniques, the linewidth (or equivalently, the decay time) of a free-induction decay (FID) signal derived from a suitable specimen is monitored while the shim coil currents are adjusted either by hand or by computer in an iterative fashion. One such technique known as Simplex is described by W. Spendley, et al in an article entitled "Simplex Algorithm," in *Techrometrics*, Vol. 4, p. 441 (1962). In using such techniques, care must be taken to avoid local minima during such "steepest descent" methods. Often, symmetry considerations can be employed, as described by F. Romeo, et al in "Magnet Field Profiling: Analysis And Correcting Coil Design," in *Magnetic Resonance in Medicine*, Vol. 1, p. 44 (1984), in the choice of phantom shape, and its deployment to diminish the importance of the selected shim components. Such iterative techniques are tedious at best, unless the approximation to the desired magnet homogeneity is already rather good, and do not satisfy the requirement for rapidity.

A third approach to shimming has evolved in accordance with which the polarizing magnetic field is measured at many points within or enclosing a volume of interest and expanded in an orthonormal basis set to calculate the contribution required from each coil component to achieve a homogeneous magnetic field. Thus, if the measurements are accurate and the expansion contains a sufficient basis set, the estimate of required changes to shim currents can be arbitrarily precise. A drawback associated with this technique is that a magnetometer probe mounted on a carriage is often used to sample the magnetic field at various points within the volume of interest. If sufficient measurements are not made, because, for example, of the relative tediousness with which measurements are made with the probe, this technique requires the application of iteration in order to reach a satisfactory level of homogeneity. This technique will be described in greater detail hereinafter.

It is, therefore, a principal object of the invention to provide a method for quickly and accurately shimming the magnet of an NMR system without the attendant drawbacks of the techniques described above.

It is another object of the invention to provide an automated data acquisition technique which more uniformly covers the volume of interest.

It is still another object of the invention to provide a data acquisition technique capable of providing magnetic field measurement and compensation in the presence of the object (e.g., patient) being studied.

SUMMARY OF THE INVENTION

A method is provided for improving the homogeneity of a magnetic field produced by a magnet system having a means for producing a main polarizing magnetic field and a plurality of correction coils for producing auxiliary magnetic fields, when energized, to compensate for imperfections in the polarizing magnetic field. The method includes the steps of obtaining chemical shift data of a phantom device positioned in the polarizing magnetic field, and deriving from the chemical shift data measurements of the polarizing magnetic field. At least a subset of the derived field measurements are expanded in an orthonormal basis set and calibration coefficients are determined for each of the correction coils. The orthonormally expanded data basis set and the calibration coefficients are used to determine the required current changes, if any, to be applied to each of the plurality of correction coils to compensate for imperfections, if any, in the polarizing magnetic field.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

DETAILED DESCRIPTION OF THE INVENTION

Figure 1:
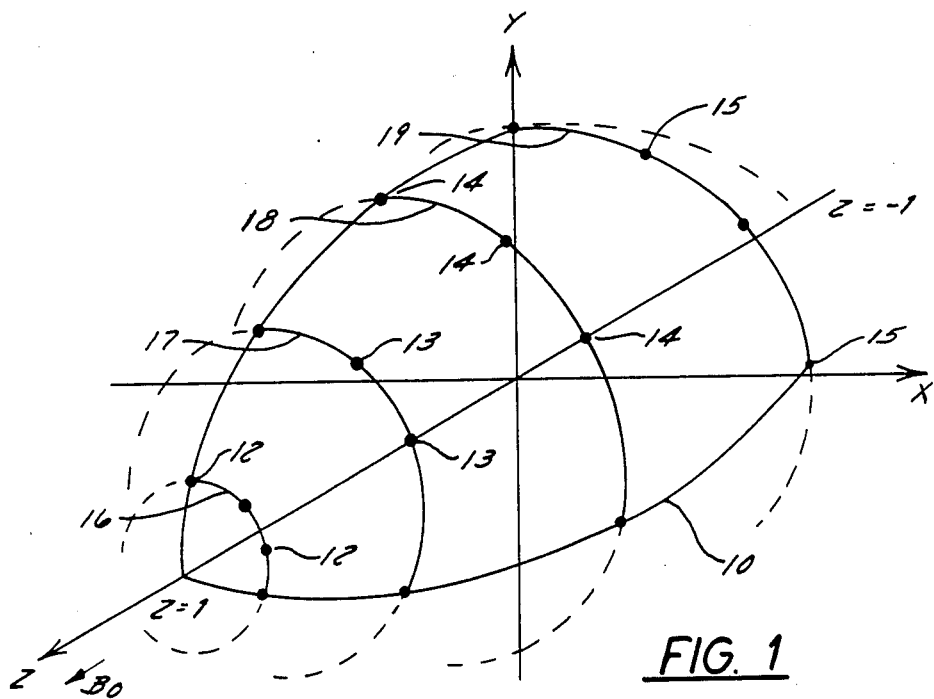
FIG. 1 depicts a conventional data sampling geometry in which data points are measured on circles coaxial with the cylindrical axis of a magnet.

It will be beneficial to an understanding of the present invention to initially consider in greater detail the third magnet shimming technique described hereinbefore. To this end, initial reference is made to FIG. 1 which depicts a volume 10 which comprises one-eighth of a sphere centered on a conventional coordinate system in which the positive Z axis corresponds to the direction of the polarizing magnetic field $B_o$. Although the discussion herein is only with reference to volume 10, it is understood that measurements are in fact carried out for the entire spherical volume which represents that portion of the magnetic field over which it is desired to improve the homogeneity. In this method, the field is measured at many points, such as exemplary points designated 12-15 disposed radially within planes 16-19, respectively. The planes are disposed perpendicularly to the magnet axis which corresponds to the Z axis, as shown in FIG. 1. The measurements are typically carried out using a magnetometer probe mounted on a carriage (not shown). The data so obtained on the surface of the sphere representing the volume of interest are expanded in an orthonormal basis set. A convenient way to perform the orthonormal expansion is to fit the data to an expansion of spherical harmonics. The expansion coefficients are in turn used to set shim coil currents, since each shim coil is typically intended to represent, and hence provide the correction for, one of the spherical harmonics. This technique as implemented in the past has been found to require iteration in order to reach a satisfactory level of homogeneity. One reason for this is that usually only seven planes, similar to planes 16-19, are sampled. It has been determined by Applicants through simulations, however, that the sampling of at least eleven planes is usually required for typical field contributions in order to accurately calculate the expansion. A difficulty which arises with the conventional method is that since the measurements are performed using a magnetometer probe, additional data can only be acquired at the expense of a time and efficiency penalty. Additionally, since the measurements are made in an unoccupied magnet bore (i.e., in the absence of the object to be imaged) the distorting effects the object has on the field are not compensated.

Another drawback associated with the sampling scheme wherein points are sampled on the surface of a sphere is that the planes at the extremeties of the Z axis, such as plane 16, FIG. 1, over-sample the surface of the sphere, while planes near the X-Y plane (plane 19) are under-sampled. Another difficulty is that only point measurements on the spherical boundary are recorded. This appears to be strictly in accord with the theory of Tesseral harmonic expansion, as well as Maxwell's equations, which state that conditions on the boundary of a closed contour determine the field everywhere within if no current sources are enclosed. However, measurements obtained within the sphere can in practice be beneficial in improving the estimated field distribution. As already indicated, such additional sampling exacts a time and efficiency penalty when the data are recorded in a point-by-point method.

Turning now to a description of the inventive method, there is provided an automated data acquisition technique which more uniformly covers the volume of interest. In accordance with the inventive method, a four-dimensional chemical shift imaging (CSI) approach is employed in which three of the coordinates correspond to spatial location and the fourth is resonant frequency. Because the resonant frequency, hence, the absolute apparent chemical shift, is dependent on the strength of the applied field, the chemical shift spectrum is expressed as fractional shift in parts per million (ppm) of the NMR frequency relative to an arbitrary reference compound. In general, in accordance with the invention, advantage is taken of the variation in the resonant frequency caused by corresponding variations in the magnetic field (apparent chemical shift information). Measurement data is acquired by positioning a phantom comprised of uniform material (e.g., water doped with copper sulfate) centered in the imaging field. It is assumed that any frequency shifts observed by monitoring the position of the water peak in the spectrum are the result of inhomogeneities in the polarizing magnetic field, not real chemical shift due to material heterogeneity.

The inventive chemical shift imaging shim technique is in general comprised of four elements: (1) acquisition of chemical shift data, (2) expansion of the acquired chemical shift information in an orthonormal basis set, (3) calibration of shim coil sensitivities, and (4) calculation of shim current changes needed to achieve the desired homogeneity. Each of these elements will be discussed next in turn.

Figure 2:
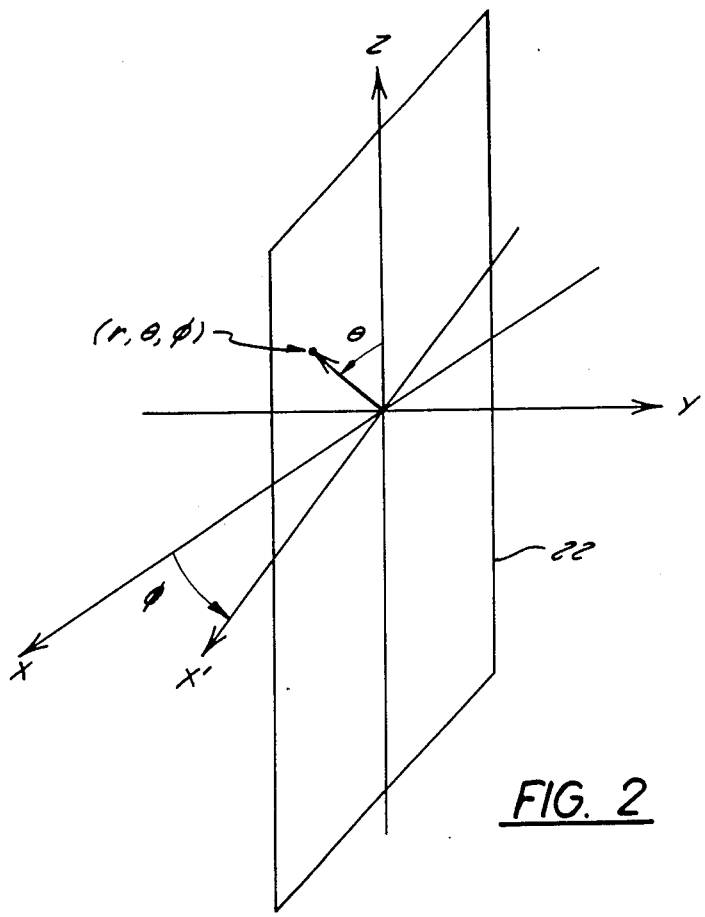
FIG. 2 depicts a data sampling geometry in accordance with the inventive CSI shimming method.
Figure 3:
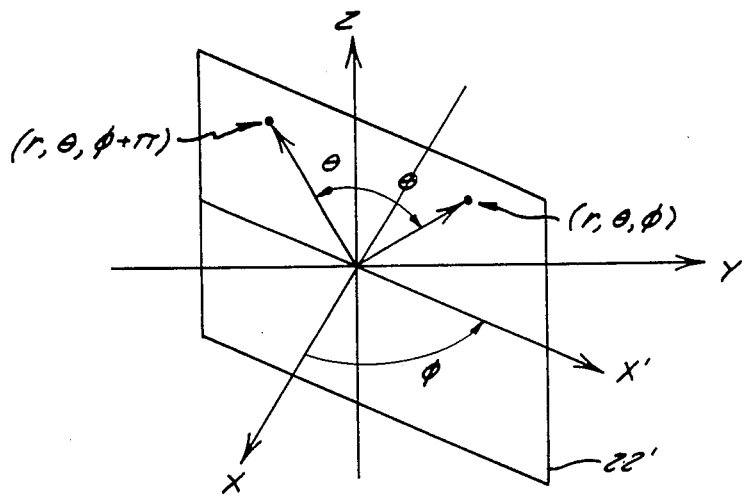
FIG. 3 is similar to FIG. 2 and further illustrates the data sampling geometry.

During the data acquisition phase, the data are collected in planes, such as plane 22 in FIG. 2, which intersect the Z axis at equal angles in $\phi$. The data may be conveniently collected on a cylindrical coordinate system and interpolated to spherical coordinates. Each slice contains data which can be measured at points (r, $\theta$) for a given angle $\phi$ (where r, $\theta$ and $\phi$ are spherical coordinates), as well as (r, $\theta$) for angle $\phi+\pi$, as shown in FIG. 3. In this manner, N slices provide 2N measurements. Typically, measurements are taken for four planes situated at $\phi=0°$, 45°, 90° and 135°. Measurements are taken for eight values of $\theta=(0°, 22.5°, 45°, 67.5°, 90°, 112.5°, 135°, 157.5°)$ and eight values of r for both + and − $\phi$ angles. This technique thus allows an economical but uniform sampling of the spherical volume.

Figure 4:
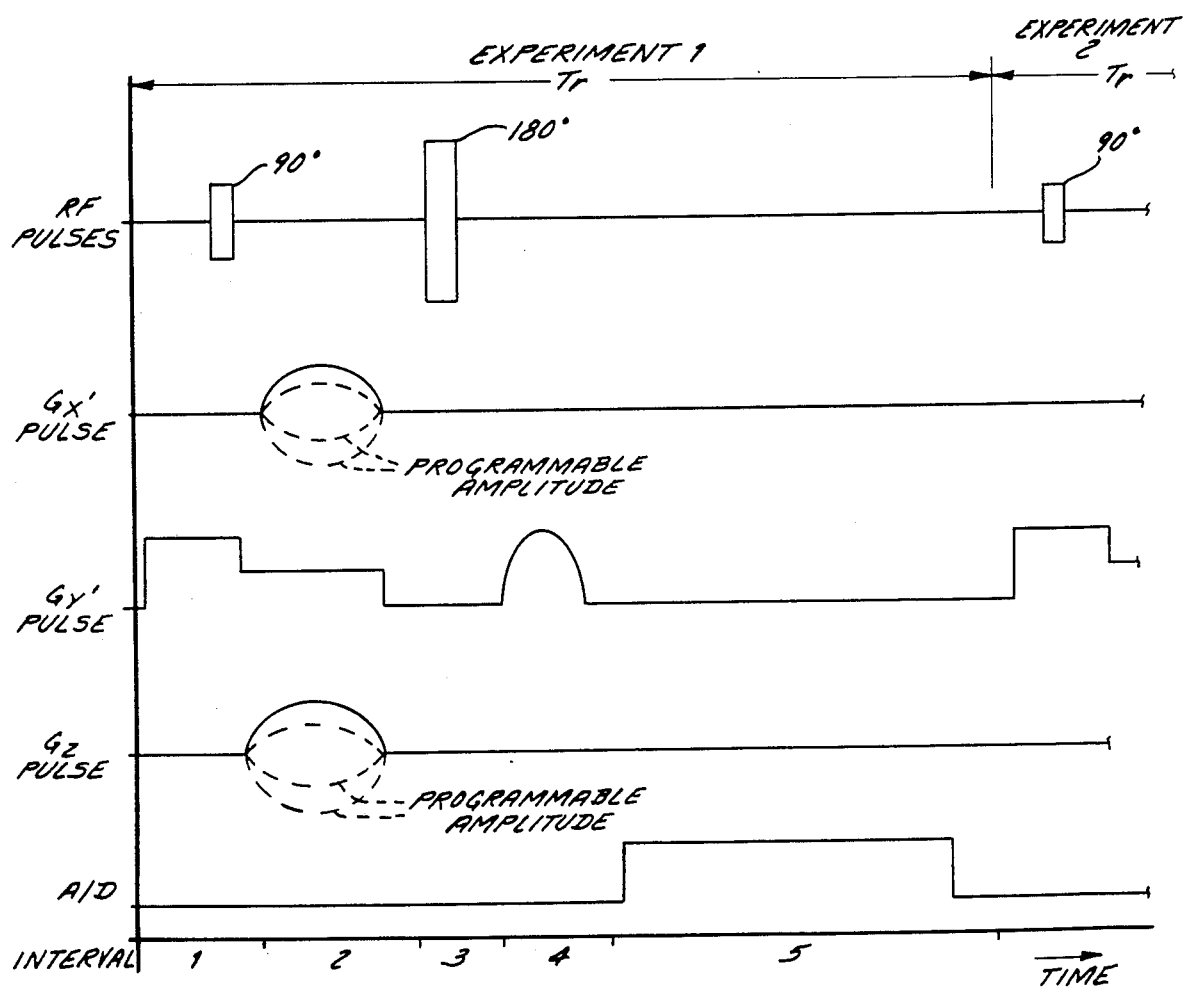
FIG. 4 depicts one experiment of an NMR pulse sequence used for acquiring CSI data.

FIG. 4 depicts one experiement comprised of intervals 1 through 5 of a pulse sequence suitable for acquiring data about the homogeneity of the magnetic field in the volume of interest. Referring now to FIG. 4, it will be seen that reference is made to gradients $G_x'$, $G_y'$, and $G_z$. For the purposes of this application, gradients $G_x'$ and $G_y'$ are defined such that at angle $\phi=0°$, $G_x=G_x'$, and $G_y=G_y'$. At other angles of $\phi$, $G_x'$ and $G_y'$ are combined by the following rotation matrix to select a slice at angle $\phi$ with respect to the z-y plane:

$$\begin{bmatrix} G_x \\ G_y \\ G_z \end{bmatrix} = \begin{bmatrix} \cos\phi & -\sin\phi & 0 \\ \sin\phi & \cos\phi & 0 \\ 0 & 0 & 1 \end{bmatrix} \begin{bmatrix} G_x' \\ G_y' \\ G_z' \end{bmatrix} \quad (1)$$

The $G_z$ gradient is normally directed in the Z-axis direction of a conventional Cartesian coordinate system.

Referring now to interval 1 in FIG. 4, there is shown a selective 90 degree RF pulse applied in the presence of a $G_y'$ gradient. The frequency content of the RF pulse is selected as predicted by the Larmor equation so as to excite nuclear spins only in the predetermined plane of interest. Phase-encoding gradients $G_x'$ and $G_z$ are applied in interval 2 in a manner similar to that used in a Fourier transform imaging technique known as spin warp. As in spin warp, different amplitudes (in the general case, time integrals) of the phase-encoding gradients $G_x'$ and $G_z$ are sequentially applied in subsequent experiments of the pulse sequence. Thus, if there are $N_x'$ and $N_z$ amplitudes of the $G_x'$ and $G_z$ phase-encoding gradients, respectively, $N_x * N_z$ separate phase-encoding experiments are required to generate data from one slice. Advantageously, $N_x'$ and $N_z$ may, for example, each be selected to equal 16. A typical sequence for implementing the phase-encoding gradients may be to select in experiment 1 one amplitude of the $G_z$ gradient and advance the $G_x'$ gradient through its range of amplitudes prior to incrementing $G_z$ to its next amplitude and repeating the process. Such an implementation of phase encoding is merely exemplary and other implementations which sequence $G_x$ and $G_z$ through the range of $N_x'$ and $N_z$ amplitudes may be utilized. Continuing with reference to FIG. 4, in interval 3, a 180 degree RF pulse is applied so as to create a spin-echo signal (not shown) in interval 5. The resulting spin-echo signal is sampled in interval 5 by an analog-to-digital (A/D) converter (not shown) in the absence of any intentional imaging gradients. Typically, the A/D window is 128 points for 128 msecs.

Following the acquisition of a data set comprised of sampled NMR spin-echo signals using, for example, the pulse sequence of FIG. 4, $N_c$ (where $N_c$ is the number of points in the spectrum, e.g., 128, 256, etc.) chemical shift images are constructed using well-known techniques. The three dimensions of the data set include time and phase-encoding amplitudes for each of the $G_x'$ and $G_z$ gradients. In general, information about the magnetic field is recovered by performing three-dimensional Fourier transformation analysis. The first transformation with respect to time yields frequency information (spectrum) as a function of the phase-encoding amplitudes of the $G_x'$ and $G_z$ gradients. Subsequent two-dimensional Fourier transformation with respect to each of $G_x'$ and $G_z$ gradient amplitudes yields a series of spectra at every pixel in a given sampled plane. The spectra at each pixel are analyzed to determine a frequency peak. The deviation ($\pm$Hz) of the frequency peak from that predicted by the Larmor equation is determined and is then related to the magnetic field $B_m$ at that pixel. More detailed information on chemical shift imaging may be obtained by reference to the article by Pykett, et al "Nuclear Magnetic Resonance: In Vivo Proton Chemical Shift Imaging," *Radiology*, Vol. 149, pp. 197-201, Oct. 1983.

Each of the $N_c$ images discussed above is $N_x'$ by $N_z$ pixels, where $N_c$ is the number of times each spin-echo signal is sampled during the A/D readout. Typically, $N_c$ may equal 128 images. Each image thus contains a different portion of the reasonance frequency spectrum. The pixel information in each of these images is used to produce an image of the magnetic field intensity by assigning the intensity of the pixel to the position of the peak of the spectrum at that point. This image of field intensity is the desired measurement which, together with other images made at other $\phi$ angles, forms the data set for expansion in an orthonormal basis set. One preferred embodiment for orthonormal basis set expansion employs spherical harmonics. The results of the orthonormal basis set expansion are obtained as samples of field $B_m(r_i, \theta_j,$ and $\phi_k)$ at discrete spherical coordinates (if expansion is in spherical harmonics).

In practice, an $N_x'=N_z=16$ pixel reconstruction has been found adequate to define the magnetic field variations with sufficient spatial resolution, since only terms to cos/sine (2 $\theta$) are retained in the expansions when spherical harmonics are used. Similarly, the four slices (providing measurements at 8 angles $\phi$) are more than adequate to define expansion terms to cos/sin (2 $\phi$). In the preferred embodiment, a pulse sequence described in application U.S. Ser. No. 673,691, now U.S. Pat. No. 4,612,504, assigned to the same assignee as the present invention and which is incorporated herein by reference, is advantageously employed in the data acquisition process. If such a sequence is used, S*(16*16+baseline views) experiments are required, where S is the number of slices. With a pulse sequence repetition time $T_r=250$ msec. (shown in FIG. 4), the data acquisition process takes about 4.3 minutes. It has also been found that $N_c=128$ yields adequate frequency resolution, with (typically) $\pm 500$ Hz range.

In the second step of the inventive technique, the field measurements $B_m(r, x', z)$ made as described above are expanded in an orthogonal basis set. This can be accomplished in various known ways, but in the preferred embodiment spherical harmonics are used. The basis is thus associated Legendre polynomials, $P_n^m(\cos \theta)$. Therefore, it is assumed (J. A. Stratten, *Electromag-* netic Theory (McGraw-Hill, New York), 1941, p. 402) that $$B_m(r,\theta,\phi) = \sum_{n=1}^{N} \left(\frac{r}{r_o}\right)^n a_{no} P_n(\cos\theta) + \sum_{n=1}^{N'} \left(\frac{r}{r_o}\right)^n \sum_{m=1}^{n} P_n^m(\cos\theta)[a_{nm}\cos m\phi + b_{nm}\sin m\phi], \quad (2)$$

where $r_o$ is the radius of the sphere to be represented, and $a_{nm}$, $b_{nm}$ are coefficients to be determined. Note that the DC term is ignored since it is of no consequence in shimming. In general, an infinite number of terms (N, N'→∞) are required to represent an arbitrary field. In practice, an assumption is made a priori that the low-order components adequately represent the field and thus only the first 12 terms with N=4, N'=3 (to $a_{31}$, $b_{31}$) are used.

The coefficients are obtained by fitting measurements to Equation (2). In principle, only data on the surface of the sphere need be used as discussed above. However, it has been found that a signal/noise benefit results from, for example, integrating over all the volume contained by the sphere. Other methods could also be used to obtain substantially the same results, e.g., least-square-fit techniques. Thus, let $$B(\theta,\phi) = \frac{1}{r_o^2} \int_0^{r_o} B_m(r,\theta,\phi) r \, dr \quad (3)$$

Then $$B(\theta,\phi) = \Sigma_n \left[ \frac{a_{no}}{n+2} P_n(\cos\theta) + P_n^m(\cos\theta)\left(\frac{a_{nm}}{n+2}\cos m\phi + \frac{b_{nm}}{n+2}\sin m\phi\right)\right]. \quad (4)$$

Hence, if the experimental data are first integrated over r as in Equation (3) and then fit to an expansion ($a'_{nm}$, $b'_{nm}$), the coefficients in Equation (2) are given by $$a_{nm} = a'_{nm}/(n+2), \quad (5a)$$

$$b_{nm} = b'_{nm}/(n+2). \quad (5b)$$

The expansion coefficients are found from:

$$a'_{no} = \frac{2n+1}{4\pi} \int_0^{\pi} \sin\theta P_n(\cos\theta) d\theta \int_0^{2\pi} \beta(\theta,\phi) d\phi, \quad (6a)$$

$$\binom{a'_{nm}}{b'_{nm}} = \frac{2n+1}{2\pi} \frac{(n-m)!}{(n+m)!} \int_0^{\pi} P_n^m(\cos\theta)\sin\theta d\theta \int_0^{2\pi} \beta(\theta,\phi) \binom{\cos}{\sin} m\phi \, d\phi. \quad (6b)$$

Thus, for a measured field $B_m(r, \theta, \phi)$, the expansion coefficients are found from Equations (3) and (6). In practice, of course, only sampled data are available, and so the integrals are replaced by sums. Straightforward Simpson's rule summation is adequate to evaluate the sums.

It is convenient to use vector notation for the expansion. Let $\psi_n$ be the basis functions, which in this embodiment are spherical harmonics:

$$\psi_n(r,\theta,\phi) = \begin{cases} \left(\frac{r}{r_o}\right)^n P_n(\cos\theta) & , n = 1,\ldots,4 \\ \left(\frac{r}{r_o}\right) P_1'(\cos\theta) \begin{matrix}\cos\phi\\ \sin\phi\end{matrix} & \begin{matrix}, n = 5\\ , n = 6\end{matrix} \\ \left(\frac{r}{r_o}\right)^2 P_2'(\cos\theta) \begin{matrix}\cos\phi\\ \sin\phi\end{matrix} & \begin{matrix}, n = 7\\ , n = 8\end{matrix} \\ \left(\frac{r}{r_o}\right)^2 P_2^2(\cos\theta) \begin{matrix}\cos\phi\\ \sin\phi\end{matrix} & \begin{matrix}, n = 9\\ , n = 10\end{matrix} \\ \left(\frac{r}{r_o}\right)^3 P_3^1(\cos\theta) \begin{matrix}\cos\phi\\ \sin\phi\end{matrix} & \begin{matrix}, n = 11\\ , n = 12\end{matrix} \end{cases} \quad (7)$$

This basis set is denoted as a 12-component column vector $[\psi_n]$. Then, Equation (2) may be written in the vector form $$B_m^{(1 \times N_b)}(r,\theta,\phi) = [c_n]^{(1 \times N_b)}[\psi_n]^{(N_b \times 1)}, \quad (8)$$

where $N_b$ is the number of basis functions, and $[c_n]$ is a $(1 \times N_b)$ row vector of the expansion coefficients ($a_{nm}$, $b_{nm}$) in the appropriate order defined by Equation (7), and $\psi_n$ is a $(N_b \times 1)$ column vector of the orthogonal spherical harmonics or other basis function, such as cylindrical harmonics.

The evaluation of $[c_n]$, using Equations (6a) and (6b), is performed next. The four 16*16 Cartesian coordinate field maps are sinc-interpolated to 64*64 and nearest neighbor interpolation applied to generate 8 r samples and 16 $\theta$ samples for each $\phi$ (slice).

Following expansion of magnetic field measurements, the third phase is the calibration of shim coils. The shim coils are typically designed such that each will represent a different component in the spherical expansion (Eq. (2)). That is, ideally each coil provides correction for only a single harmonic so that collectively the individually adjustable coils correct for wide variations in field homogeneity. If this were accurately so, then the expansion coefficients obtained as described above would each be directly proportional to the shim current required for the corresponding coil. It has been found, however, that, in practice, each coil requires in general a sum of all the basis functions for complete representation. The largest "impurity" terms arise from basis functions with like symmetries (i.e., ZX and $Z^2X$ couple to X, etc.).

It is assumed, therefore, that for unit current in the i'th shim coil, a field $S_i(r, \theta, \phi)$ is produced which may be represented as a component of the column vector $$[S_i]^{(12 \times 1)} = [S_{in}]^{(12 \times N_b)}[\psi_n]^{(N_b \times 1)} \quad i=1,\ldots,12, \quad (9)$$

where $S_{in}$ is a component of a 12*12 matrix. When the $[S_{in}]$ matrix is determined, it is stored and used to calibrate the shim coils. Thus, the total field produced by the shim coils when currents described by a current vector $[I_i]$ are applied is $$B_{shim} = [I_i]^{(1 \times 12)}[S_i]^{(12 \times 1)} = [I_i]^{(1 \times 12)}[S_{in}]^{(12 \times Nb)}[\psi_n]^{(Nb \times 1)} \quad (10)$$

It is desirable to use currents $[I_i]$ such that the field $B_{shim}$ produced by the shim coils just cancels the measured field $B_m$. Thus, from Equations (8) and (10), it is desirable that $$B_m + B_{shim} = 0,$$

or $$[c_n][\psi_n] + [I_i][S_{in}][\psi_n] = 0. \quad (11)$$

Now, if all the shim coils are unique $[S_{in}]$ has an inverse and the desired solution becomes $$[I_i] = -[c_n][S_{in}]^{-1}. \quad (12)$$

Thus, Equation (12) provides a vector of currents which must be applied to shim out (correct) the error in field $B_m$. It is necessary to first calculate, using Equation (12), the calibration matrix $[S_{in}]^{-1}$ for the shim set. (Note that if each coil represented a spherical harmonic exactly then $[S_{in}]^{-1}$ would be diagonal, for appropriate ordering.) The matrix $[S_{in}]$ is found by: (1) measuring the field produced by an arbitrary shim current setting using the CSI technique above (Equation (8)); (2) changing the current a known amount in each coil separately and measuring the response; (3) subtracting (1) from (2); and (4) inverting the resulting matrix, which is stored, for example, in computer memory and is the calibration matrix used for correction.

The shim current changes used during the calibration process above are typically 1 to 2 amperes for the non-linear gradient terms and 200 ma for X, Y, and $Z_1$ coils.

In the final step, shim current correction is accomplished. The required current changes for each coil are obtained using Equation (12) above. Assuming the calibration matrix $[S_{in}]^{-1}$ is available, one need only measure the field and obtain $[c_n]$, calculate the current changes from Equation (12) and apply those changes to each of the 12 currents (one for each correction coil). This procedure will compensate alteration in the magnet ambient (e.g., movement of furniture or equipment, or for each new patient, etc.) without recalibration as long as the shim coils are unaltered. The calculated shim coil current changes to shim the magnet may be set manually by operator adjustment of the appropriate shim coil power supplies or automatically if proper interface is provided between the computer and the various shim coil power supplies.

The inventive technique has been used successfully on several research system magnets. It is desirable, to achieve accurate results, that the effects of eddy currents induced by application of magnetic field be accurately compensated since unintentional magnetic field gradients can distort the measurements. One method for achieving eddy current compensation is disclosed and claimed in copending, commonly assigned U.S. patent application Ser. No. 816,074, which is incorporated herein by reference.

One experiment was performed using a 32 cm diameter by 40 cm long water phantom and shimming over a 25 cm diameter sphere. The shim current changes determined as described above were applied and the phantom rescanned. A new set of currents was calculated and a 500 ma change to the $Z_3$ coil was recommended. After application of that change, the final spectrum obtained was about 0.3 ppm wide, full-width half-maximum (FWHM), over the entire phantom (with no gradients applied).

An attempt was made to shim the magnet from "scratch" by shutting off all shim currents except the linear gradients $G_x$, $G_y$ and $G_z$. The bandwidth of the CSI sequence was widened from the usual $+500$ Hz to $+2$ KHz to encompass the poor linewidth of the un-shimmed magnet. The correction currents predicted were within 100 ma of the previously determined values on all of the coils but Z3 and Z4 (they were within 0.5 amp). Thus, a very close correction was obtained in just one measurement sequence. A second iteration would provide a final correction. The success of this technique, however, depends upon the linear gradients being reasonably close since they are the most sensitive. This is readily achieved by hand while watching the spectrum.

Another test of the technique was performed when the magnet was ramped down for cryostat pumping and relocated approximately 0.2M closer to the floor. New shim currents were calculated (as much as 1 amp differences in some coils) and the 0.3 ppm linewidth was reestablished in just one application of the inventive technique.

The technique has been found to yield narrow linewidths when the phantom used to establish the shim is the same as that used to measure the linewidth. However, when a phantom with a different shape is used, apparently poor homogeneity is observed. The difficulty is that the presence of the phantom distorts the field; the nature of the distortion depends on the shape of the object. For example, a spherical homogeneous volume with magnetic susceptibility $\chi$ ($= -12$ ppm for water) supports a uniform field inside of value $B_o(1 + \chi/4)$, where $B_o$ is the air field value. More generally, an ellipsoid of revolution also produces a uniform field with a demagnetizing factor which depends on the aspect ratio. Other shapes will cause some distortion of the field by other than a constant and are thus contributors to the measured inhomogeneity. The shim procedure will cause these distortions to be cancelled out along with the external errors, and thus a narrow linewidth can be obtained on the shim phantom. When an object with a different shape is used, the field may be distorted differently and it may appear to have poor homogeneity.

Thus, the shim setting depends on the object being measured (at the ppm level) and a decision must be made as to the appropriate object. Thus, the most appropriate phantom should probably be a partially filled water container in order to mimic the shape of a human subject.

The expansion of magnetic field measurements deduced from CSI techniques is one of the approaches for expansion of the data in an orthonormal basis set. Alternative approaches include, for example, Fourier or Fourier-Bessel basis functions.

In fact, since the data is obtained with cylindrical symmetry, an experiment has been performed to determine whether a better fit of the data could be obtained using cylindrical harmonics. The method employed expansion of the chemical shift images using Fourier-Bessel expansion with complex coefficients. The required shim coil currents were then estimated using least-squares techniques using a model described by a real function which has a linear orthogonal expansion with complex coefficients.

The use of cylindrical harmonics did not provide more accurate solutions to the shim coil currents than were obtained with spherical harmonics. The use of cylindrical harmonics did point out, however, that the solutions must be made more consistent for varying sizes in the sampling region. For example, improved schemes for least squares fits for both cylindrical and spherical harmonics are chosen to better model the field of the object imaged.

It will be recognized that other orthogonal expansions could be used to fit data sampled with cylindrical symmetry such as Zernicke polynomials which have been used in reconstruction tomography. Of particular interest are the prolate spheroidal polynomials which are orthogonal over a finite region and are band limited. These functions might reduce the matrix inverse operation to a finite sum over the samples in the radial direction.

Figure 5:
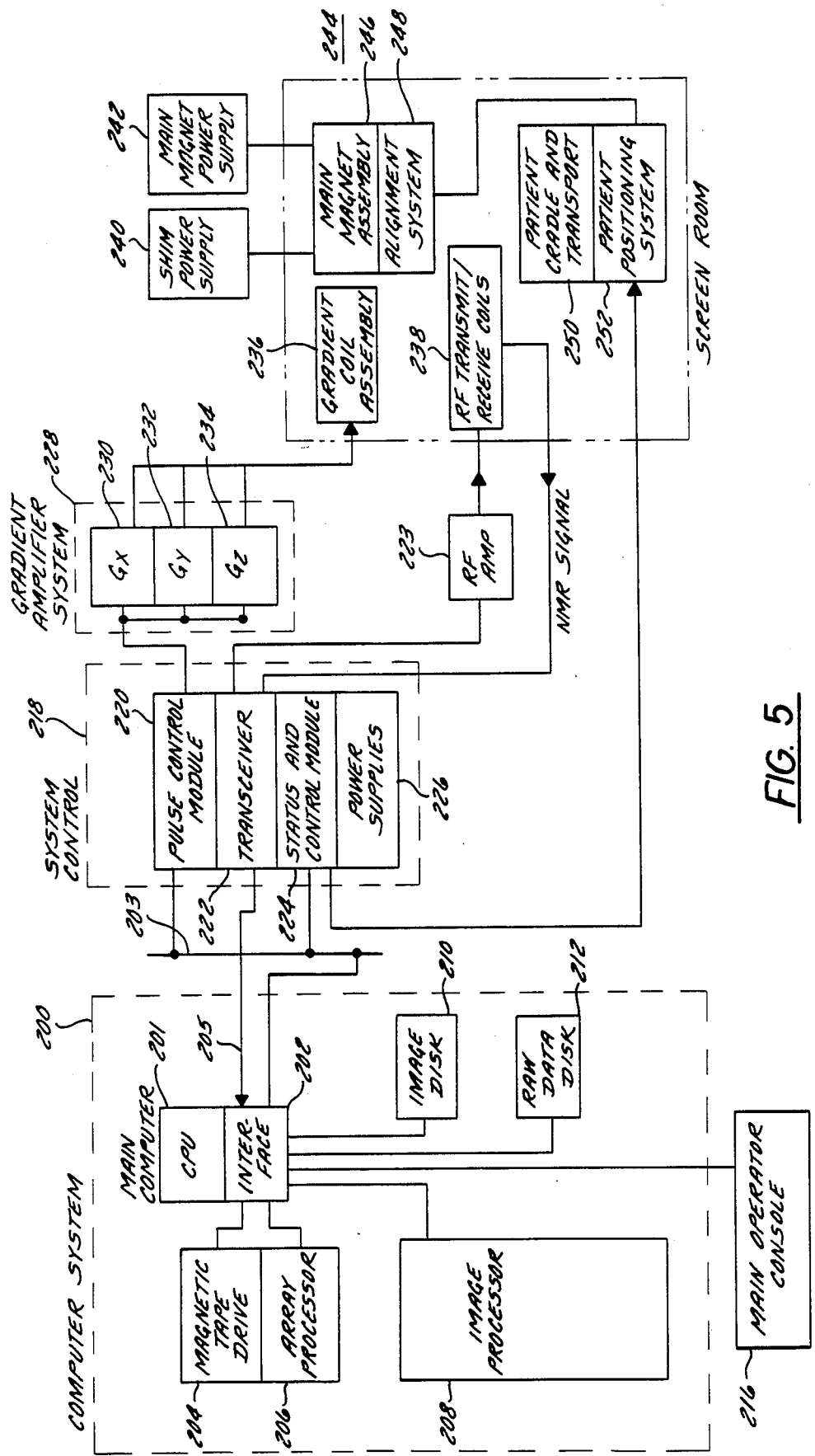
FIG. 5 depicts in block schematic form the major elements of an NMR system suitable for practicing the invention.

FIG. 5 depicts in block diagram form the major components of an NMR system suitable for practicing the invention. Overall system operation is under the control of a computer system generally designated 200 which includes a main computer 201 (such as a Data General MV4000). The computer has associated therewith an interface 202 through which a plurality of computer peripheral devices and other NMR system components are coupled. Among the computer peripheral devices is a magnetic tape drive 204 which may be utilized under the direction of the main computer for archiving patient data and images to tape. Processed patient data may also be stored in an image disc storage device designated 210. An array processor 206 is utilized for pre-processing of data and data reconstruction. The function of image processor 208 is to provide interactive image display manipulation such as magnification, image comparison, and gray scale adjustment. The computer system is provided with a means to store raw (unreconstructed) image data utilizing a disc data storage system designated 212. A main operator console 216 is also coupled to the computer by means of interface 201 and provides the operator with the means to input data pertinent to a patient study as well as additional data necessary for proper NMR system operation, such as initiating and terminating scans. The operator console may also be used to display images stored on discs or magnetic tape.

The computer system exercises control over the NMR system by means of control and gradient amplifier systems generally designated 218 and 228, respectively. The computer communicates with system control 218 by means of a digital communication network 203 (such as the Ethernet network) in a manner well known to those skilled in the art. The system control includes several subsystems such as the pulse control module (PCM) 220, a radio-frequency transceiver 222, a status and control module (SCM) 224, and the power supplies generally designated 226 necessary to energize the components. The pulse control module utilizes computer control signals to generate digital timing and control signals such as the current wave shapes used for gradient coil excitation as well as RF envelope waveforms utilized by the transceiver for modulating of RF pulses. The gradient wave shapes are applied to the gradient amplifier system generally comprised of amplifiers 230, 232, and 234, each utilized to excite a corresponding gradient coil in an assembly generally designated 236 and which is part of a magnet assembly 246. When energized, the gradient coils generate substantially linear, mutually orthogonal magnetic-field gradients $G_x$, $G_y$, and $G_z$ directed in the X-, Y- and Z-axis directions of a Cartesian coordinate system. The gradients are utilized in combination with radio-frequency pulses generated by transceiver 222 to encode spatial information into the NMR signals emanating from the region of the patient being studied. Waveforms and control signals provided by the pulse control module are utilized by transceiver subsystem 222 for RF carrier modulation and control of the operating mode; that is, the transmit or receive mode. In the transmit mode, the transmitter provides a radio-frequency carrier waveform modulated in accordance with the control signals provided by the pulse control module to an RF amplifier 223 which then energizes RF coils 238 which are situated within main magnet assembly 246. The NMR signals radiated by the excited nuclei are sensed by the same or a different RF coil than is used for transmitting. The signals are detected, filtered, and digitized in the receiver section of the transceiver. The digitized signals are transmitted to the main computer for processing through interface 202 by means of a dedicated, unidirectional, high-speed digital link 205.

The PCM and SCM are independent subsystems both of which communicate with main computer 201, peripheral systems, such as patient positioning system 252, as well as to one another by means of link 203. The PCM and SCM are each comprised of a 16-bit microprocessor (such as an Intel 8086) for processing commands from the main computer. The SCM includes means for acquiring information regarding cradle position and position of the moveable patient-alignment fan beam. This information is used by the main computer to modify image display and reconstruction parameters (such as offset). The SCM also initiates functions such as actuation of the patient transport and laser systems.

The gradient coil assembly 236 and the RF transmit and receiver coils 238 are mounted within the bore of the magnet utilized to produce the polarizing magnetic field. The magnet forms a part of the main magnet assembly which includes the patient alignment system 248, adjustable shim coil power suppies designated 240, and a main magnet power supply 242. The shim power supplies are utilized to energize shim coils associated with the main magnet and which are used to correct inhomogeneities in the polarizing magnetic field. In the case of a resistive magnet, main magnet power supply 242 is utilized to continuously energize the magnet. In the case of a superconductive magnet, the power supply is utilized to bring the magnet to the proper operating field and then is disconnected. The patient alignment system 248 operates in combination with a patient cradle and transport system 250 and patient positioning system 252. To minimize interference from external sources, the NMR system comprised of the main magnet assembly, the gradient coil assembly, and the RF transmit and receiver coils, as well as the associated power supplies and patient-handling devices, are enclosed in an RF-shielded room generally designated 244. The shielding is generally provided by a copper or aluminum screen network which encloses the entire room. The screen room serves to contain the RF signals generated by the system while shielding the system from RF signals generated outside the screen room. A bidirectional attenuation of approximately 100 db. is typical in the frequency range of operation. The status and control module 226, and the other subsystems ensure the overall system integrity.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed is:

1. A method for improving the homogeneity of a magnetic field produced by a magnet system having a means for producing a main polarizing magnetic field and a plurality of correction coils for producing auxiliary magnetic fields, when energized, to compensate for imperfections in the polarizing magnetic field, said method comprising the steps of:
   a. obtaining a plurality of chemical shift images of a phantom device positioned in the polarizing magnetic field;
   b. deriving from said chemical shift images measurements of the polarizing magnetic field in the regions imaged;
   c. expanding in an orthonormal basis set at least a subset of the derived field measurements;
   d. determining a calibration coefficient for each of said correction coils;
   e. using the orthonormally expanded data basis set and said calibration coefficients to determine the required current changes, if any, to be applied to each of said plurality of correction coils to compensate for imperfections, if any, in said polarizing magnetic field.

2. A method for shimming a magnetic field produced by a magnet system having field means for producing a main polarizing magnetic field and having a plurality of correction coils for producing auxiliary magnetic fields to compensate for imperfections in said polarizing magnetic field, said method comprising the steps of:
   a. obtaining chemical shift data of a phantom device positioned in said polarizing magnetic field;
   b. deriving measurements of said polarizing magnetic field from said chemical shift data;
   c. expanding at least a subset of said derived field measurements according to a preselected basis; and
   d. determining the required current changes, if any, to be applied to each of said correction coils to compensate for imperfections, if any, in said polarizing magnetic field according to said expanded field measurements.

3. The method of claim 2 wherein said preselected basis is an orthonormal basis.

4. The method of claim 3 wherein said orthonormal basis expansion is achieved using spherical harmonics.

5. The method of claim 4 wherein said spherical harmonics are represented by Legendre polynomials.

6. The method of claim 3 wherein said orthonormal basis expansion is achieved using cylindrical harmonics.

7. The method of claim 2 wherein said current determining step further uses calibration coefficients for said correction coils.

* * * * *